United States Patent [19]
Park et al.

[11] Patent Number: 6,049,116
[45] Date of Patent: Apr. 11, 2000

[54] TWO-COLOR INFRARED DETECTOR AND FABRICATION METHOD THEREOF

[75] Inventors: Seung-Man Park; Jae Ryong Yoon; Jae Mook Kim; Hee Chul Lee; Choong-Ki Kim, all of Daejon, Rep. of Korea

[73] Assignee: Agency for Defense Development, Rep. of Korea

[21] Appl. No.: 09/078,212

[22] Filed: May 13, 1998

[30] Foreign Application Priority Data

Sep. 13, 1997 [KR] Rep. of Korea ................... 97/47365

[51] Int. Cl.$^7$ ................................................. H01L 31/00
[52] U.S. Cl. ........................ 257/442; 257/440; 257/614
[58] Field of Search ................................. 257/440, 442, 257/450, 614

[56] References Cited

U.S. PATENT DOCUMENTS

| | | | |
|---|---|---|---|
| 5,149,956 | 9/1992 | Norton | 250/211 |
| 5,457,331 | 10/1995 | Kosai et al. | 257/188 |
| 5,466,953 | 11/1995 | Rosbeck et al. | 257/185 |
| 5,559,336 | 9/1996 | Kosai et al. | 250/370.13 |
| 5,731,621 | 3/1998 | Kosai | 257/440 |
| 5,751,049 | 5/1998 | Goodwin | 257/440 |
| 5,959,339 | 9/1999 | Chapman et al. | 257/440 |

FOREIGN PATENT DOCUMENTS 407094693  4/1995  Japan .

OTHER PUBLICATIONS

J. Vac. Sci. Technol.A3(1). Jan./Feb. 1985, pp. 238–245 "Potential barriers in HgCdTeheterojunctions", P.R. Bratt and T.N. Casselman.
J. Vac. Sci. Technol.B10(4), Jul./Aug. 1992, pp. 1626–1632 "Bias–switchable dual–band HgCdTe infrared photodetector", E.R. Blazejewski, et al.
Journal of Electronic Materials, vol. 24, No. 5, 1995, pp. 669–679 "Independently Accessed Back–to–Back HgCdTe Photodioses: A New Dual–Band Infrared Detector", M.B. Reine, et al.

*Primary Examiner*—David Hardy
*Assistant Examiner*—Huy Bui

[57] ABSTRACT

A structure and the fabrication method of two-color IR detector are disclosed. Disclosed two-color IR detector structure is a n-p-N structure which can be realized using only two-layer HgCdTe. The most important factor in the two-color IR detector structure is the formation of the potential barrier in the conduction band of p-N heterojunction. This potential barrier prevents photogenerated minority carriers in p-HgCdTe region from diffusing to and being collected by N-HgCdTe region (larger band gap diode). The calculated potential barrier heights under the thermal equilibrium at 77 K are 21 kT (141 meV) and 13.4 kT (89 meV) for the cases of p-$Hg_{0.78}Cd_{0.22}Te$/N-$Hg_{0.69}Cd_{0.31}Te$ and p-$Hg_{0.69}Cd_{0.31}Te$/N-$Hg_{0.636}Cd_{0.364}Te$ with each side carrier concentration of $5\times10^{15}$ and $1\times10^{16}$ cm$^{-3}$, respectively. It is confirmed that spectral response wavelength range of two diodes is well distinguished and two-color detector shows very low spectral crosstalk.

5 Claims, 9 Drawing Sheets

6,049,116

TWO-COLOR INFRARED DETECTOR AND FABRICATION METHOD THEREOF

BACKGROUND OF THE INVENTION

1. Field of the Invention

The present invention relates to a structure of infrared (IR) detector and a fabrication method thereof, and in particular to the two-color(dual band) IR detector.

2. Description of the Backgound Art

One of the most interesting and challenges in the field IR detectors is the realization of single chip multi-spectral detectors for many applications. This is because improved IR system flexibility and capability can be realized through the use of multi-spectral sensor and imaging arrays. Simultaneously and independently operable single chip multi-color sensor and imaging arrays are required for small size and compact applications for tracking rapidly moving objects.

The evolution of epi-layer growth technology yields multi-layer IR sensitive materials on the proper substrate. Owing to the advent of the multi-layer HgCdTe wafer, single chip HgCdTe infrared focal plane array (FPA) concepts for dual band detection (two color detection) have been developed. Two configurations which can be realized using multi-layer HgCdTe have been attractive. The first one is bias selectable two color HgCdTe IR detectors (we called BSTCD) which was disclosed in Journal of Vacuum Science & Technology B 10, (1992) 1626–1632. The second is independently accessible two color IR detectors (also called IATCD) disclosed in Journal of Electronic Materials 24, (1995) 669–679. These two concepts are based on the multi-layer heterostructure utilizing HgCdTe of desired spectral bands.

The structure of BSTCD and is N-P⁺-n, is operated by biasing between the two terminals. One bias polarity results in LWIR (long wavelength IR, 8–14 μm) detector response, while the opposite polarity results in MWIR (middle wavelength IR, 3–5 μm) detector response. This device was realized with three layer $Hg_{(1-x)}Cd_{(x)}Te$ grown by molecular beam epitaxy.

Even though the bias selectable dual-band HgCdTe IR detector affords perfect spatial collocation of the two detectors, it has the inherent drawback of not allowing temporal simultaneity of detection. Either one or the other photodiode is functioning, depending on the bias polarity applied across the back-to-back pair. Other problems also arise from the fact that it does not allow independent selection of the optimum bias for each photodiode, and that there can be substantial MW crosstalk in the LW detector due to injection from the floating forward-biased MW photodiode into the LW photodiode.

Recently, a true independently accessible two-color IR detector (IATCD) was successfully demonstrated. The IATCD provides independent electrical access to each of two spatially collocated back-to-back photodiodes so that true simultaneous and independent detection and integration of MW and LW photocurrents are also accomplished.

However, the above described IATCD is a p-n-N-P structure formed by four $Hg_{(1-x)}C_{(x)}Te$ layers grown sequentially onto a CdZnTe substrate. The sequential growth of four HgCdTe layers is very hard to implement with current HgCdTe growth techniques. Thus, low yield and high cost concerns are critical drawbacks of this manufacturing procedure.

Therefore, in the present invention, the new structure of two-color IR detector and its fabrication method to overcome the aforementioned problems are provided.

SUMMARY OF THE INVENTION

It is an object of the present invention to provide a structure and a fabrication method for two-color IR detectors which are capable of independently biasing the detector and simultaneously detecting and integrating a two-color IR signal with low cost.

To achieve the above objects, there is provided a two-color IR detector according to an embodiment of the present invention which includes an IR transparent semiconductor substrate, an N-type $Hg_{(1-y)}Cd_{(y)}Te$ layer having a relatively wider energy band gap, a p-type $Hg_{(1-x)}Cd_{(x)}Te$ layer having a relatively narrower energy band gap than that of that previous N—$Hg_{(1-y)}Cd_{(y)}Te$ layer, and an p-n junction formed on the p-type $Hg_{(1-x)}Cd_{(x)}Te$ layer.

A two color IR detector according to an embodiment (two-color detector of MW/LWIR) of the present invention includes an IR transparent semiconductor substrate, an N-type $Hg_{(1-y)}Cd_{(y)}Te$ (0.28<y<0.32) layer formed on the semiconductor substrate, a p-type $Hg_{(1-x)}Cd_{(x)}Te$ (0.19<x<0.25) layer formed on the N-type $Hg_{(1-y)}Cd_{(y)}Te$ layer, an n-type HgCdTe formed on a selective region of the p-type $Hg_{(1-x)}Cd_{(x)}Te$ layer, the metal-HgCdTe contacts formed on the p-type, n-type, and N-type HgCdTe layers, the metal 1 for electrical line between contacts and bump pads, and the metal 2 for bump.

A two-color IR detector according to another embodiment (two-color detector of SW/MWIR) of the present invention which includes an IR transparent semiconductor substrate, a anti-reflecting film formed on one surface of the semiconductor substrate, an N-type $Hg_{(1-y)}Cd_{(y)}Te$ (0.35<y<0.45) layer formed on another surface of the semiconductor substrate, a p-type $Hg_{(1-x)}Cd_{(x)}Te$ (0.28<x<0.32) layer formed on the N-type $Hg_{(1-y)}Cd_{(y)}Te$ layer, an n-type HgCdTe formed on the delineated region of the p-type $Hs_{(1-x)}Cd_{(x)}Te$ layer, the metal-HgCdTe contacts formed on the p-type, n-type, and N-type HgCdTe layers, the metal 1 for electrical line between contacts and bump pads, and the metal 2 for bump.

A two color IR detector fabrication method according to still another embodiment of the present invention includes the steps of preparing a IR transparent semiconductor substrate, forming an N-type $Hg_{(1-y)}Cd_{(y)}Te$ layer on the IR transparent semiconductor substrate, forming a p-type $Hg_{(1-x)}Cd_{(x)}Te$ layer on the N-type $Hg_{(1-y)}Cd_{(y)}Te$ layer, forming an n-type $Hg_{(1-x)}Cd_{(x)}Te$ on the delineated region of the p-type $Hg_{(1-x)}Cd_{(x)}Te$ layer using an ion implantation or impurity diffusion process, forming an insulation film on the HgCdTe surface, isolating each cell by etching the p-type $Hg_{(1-x)}Cd_{(x)}Te$ layer and forming the insulation film thereon, forming the metal-HgCdTe contacts on the p-type $Hg_{(1-x)}Cd_{(x)}Te$, N-type $Hg_{(1-y)}Cd_{(y)}Te$, and n-type $Hg_{(1-x)}Cd_{(x)}Te$ respectively.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE PREFERRED EMBODIMENTS

Figure 1:
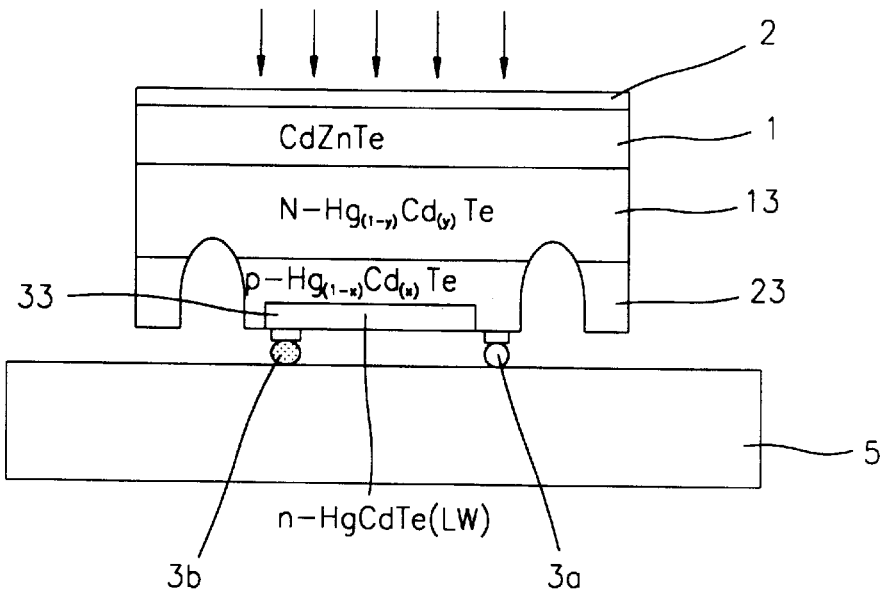
FIG. 1 illustrates the cross-sectional view of a two-color detector according to the present invention.

A two-color detector having the back-to-back diode structure of the n-p-N-HgCdTe on IR transparent substrate is shown in FIG. 1. The detector structure is for backside-illumination, that is, infrared radiation should be incident from the substrate 1 side. The two color IR HgCdTe detector uses two bumps 3a, 3b per unit cell for interconnection to the silicon readout chip 5 as shown in FIG. 1. One bump 3b contacts with the n-type region of the LW photodiode, the other bump 3a contacts with the p-type region 23 of the LW photodiode as shown in FIG. 1. The N-type regions 13 of all the MW photodiodes in the two-color detector array are electrically connected and accessed at the edge of the array through a common contact. The LW photodiode is accessed through the two bumps 3a, 3b, while the MW photodiode is accessed through the contacts in the p-type region and the array ground (common contact). All bumps are identical in height and are on the same plane, which is necessary for high interconnection yield in large hybrid IRFPAs. Formation of n-HgCdTe region 33 can be accomplished by ion implantation or diffusion. Such junction formation retains the key feature of having both bumps 3a, 3b on the same level. An alternative approach for forming the n-HgCdTe region 33 is epitaxial growth. However, this approach requires a two-step mesa structure for junction isolation, and accordingly, the bumps 3a, 3b in each unit cell are not on the same level. In more detail, the LW photodiode D2 (illustrated in FIG. 2) comprising the p-type $Hg_{(1-x)}Cd_{(x)}Te$ layer 23 and the n-type $Hg_{(1-x)}Cd_{(x)}Te$ layer 33 is connected with the readout circuit 5 through two bumps 3a and 3b. The MW photodiode D1 comprising the N-type $Hg_{(1-y)}Cd_{(y)}Te$ layer 13 and the p-type $Hg_{(1-x)}Cd_{(x)}Te$ layer 23 is connected with the readout circuit 5 through the bump 3a and a common contact bump (not shown).

Figure 2:
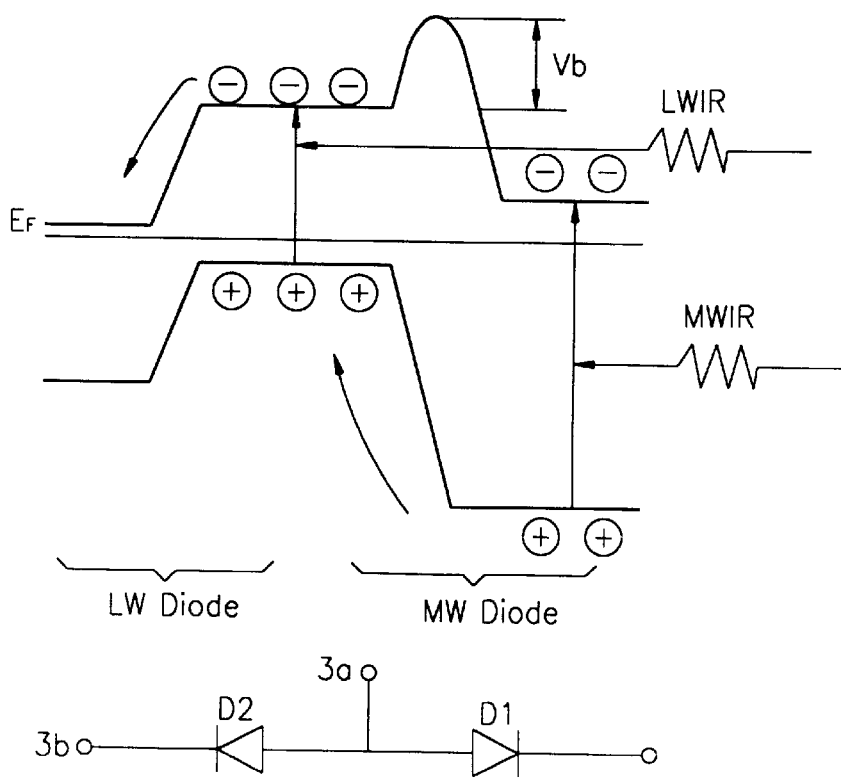
FIG. 2 illustrates the schematic energy band diagram of a two color IR detector according to the present invention.

The operational principle of the two-color IR detector of MW/LWIR combination according to the present invention will be explained with reference to FIG. 1 and FIG. 2. FIG. 2 shows the schematic energy band diagram of the two-color IR detector (MW/LW IR combination) according to the present invention. The MWIR is absorbed in the N-type $Hg_{(1-y)}Cd_{(y)}Te$ layer 13 (0.28<y<0.32) and the photo-generated minority carriers in the N-type 13 $Hg_{(1-y)}Cd_{(y)}Te$ layer diffuse to the p-type $Hg_{(1-x)}Cd_{(x)}Te$ layer 23 (0.19<x<0.25), thus contributing a MW signal. The LWIR is absorbed in the p-type $Hg_{(1-x)}Cd_{(x)}Te$ layer 23 (0.19<x<0.25), and the photo-generated minority carriers in the p-type $Hg_{(1-x)}Cd_{(x)}Te$ layer see the potential barrier in the p-N heterojunction. The p-N heterojunction plays a critical role in that it prevent LW photo-generated minority carriers from diffusing to and being collected by the MW photodiode D1. The photo-generated minority carriers do not diffuse to the MWIR absorption layer 13 but diffuse to the n-type $Hg_{(1-x)}Cd_{(x)}Te$ layer 33, thus contributing a LW signal. The LW n-p homojunction can be formed by either ion implantation or epitaxially grown junction, but ion-implanted junction is advantageous in hybridization with readout circuit because it provides planar structure and bumps 3a, 3b are formed on the same level. This two-color IR detector can be independently and simultaneously accessible, that is, true independent and simultaneous detection and integration of MW and LW photocurrent can be accomplished with this simple n-p-N structure. An anti-reflection layer 2 in FIG. 1 is formed to prevent incident radiation from reflecting at the surface of substrate 1.

Figure 3:
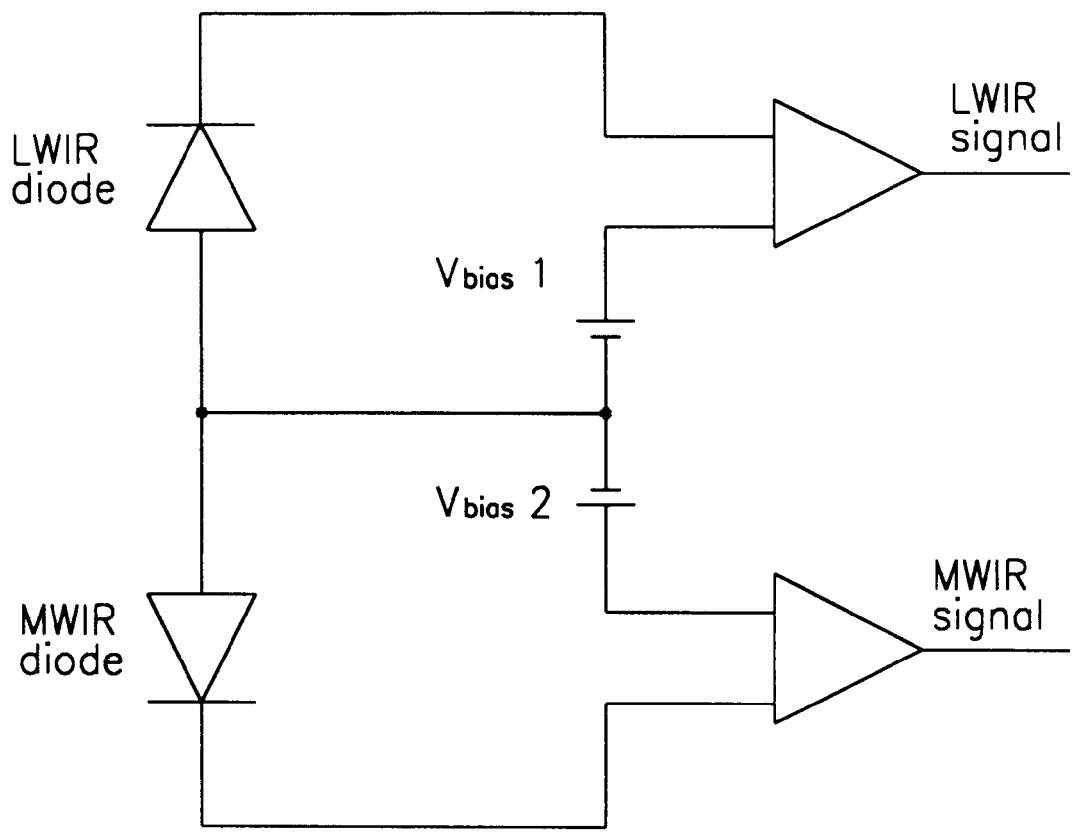
FIG. 3 illustrates the schematic readout circuit per unit cell of a two-color detector according to the present invention.

The MW and LW photocurrents from this two-color IR detector are completely independent. FIG. 3 shows two preamplifiers and two bias voltage sources connected to the MW and LW photodiodes in such a way as to provide independent MW and LW output signals. Therefore, this two-color detector can be simultaneously accessible and optimum biasing for two diodes is independently adjustable. That is, simultaneous detection, independent biasing and integration of disclosed two-color IR detector could is accomplished.

It is also possible to fabricate a two-color IR detector of the SW/MWIR combination only by varying the cadmium mole fraction of "x" and "y" in the p-type $Hg_{(1-x)}Cd_{(x)}Te$ layer 23 and N-type $Hg_{(1-y)}Cd_{(y)}Te$ layer 13. Therefore, the operation of the two-color IR detector of the SW/MWIR combination is identical to that of the MW/LWIR combination. In case of the SW/MWIR combination two-color IR detector, the range of x in the p-type $Hg_{(1-x)}Cd_{(x)}Te$ layer 23 can be varied from 0.28 to 0.32 and the range of y in the N-type $Hg_{(1-y)}Cd_{(y)}Te$ layer 13 can be varied from 0.35 to 0.45 in accordance with aimed cutoff wavelengths.

The most important factor in the two-color IR detector according to the present invention is the formation of potential barrier in the conduction band of the p-N heterojunction. This potential barrier can be formed by doping control during epitaxy growth. In actual growth of p-N HgCdTe layers, impurity doped N-type $Hg_{(1-y)}Cd_{(y)}Te$ layer (with a doping concentration about $(1-5) \times 10^{15}$ cm$^{-3}$ is firstly grown on the substrate. Sequentially, a p-$Hg_{(1-x)}Cd_{(x)}Te$ layer with a p-type doping concentration of $1 \times 10^{16}$ cm$^{-3}$ is grown on the N-$Hd_{(1-x)}Cd_{(y)}Te$ layer. Then, the p-type impurity introduced in the p-$Hg_{(1-x)}Cd_{(x)}Te$ layer diffuses to the N-type $Hg_{(1-y)}Cd_{(y)}Te$ layer. Thus, the location of the p-N junction will be formed in the side of the large band gap of the N-type $Hg_{(1-y)}Cd_{(y)}Te$ layer. This creates the potential barrier in the conduction band. Generally, the potential barrier formed in the p-N heterojunction is affected by the following factors: 1) the energy band gap difference, 2) the composition grading width, 3) the location of the p-N junction, 4) the doping concentration of each layer of p-type and N-type, 5) the electron affinity difference, etc.

As the selection of the wavelength region was made, the energy gap difference and the electron affinity difference were determined. Thereafter, the a simulation was performed such that the electron concentration of N-$Hg_{(1-y)}Cd$ $_{(y)}$Te layer was $5\times10^{15}/cm^3$, and the hole concentration of the p-$Hg_{(1-x)}Cd_{(x)}$Te layer was $1\times10^{16}/cm^3$. In addition, for the simulation, it was assumed that the position of the p-N junction was located 0.5 μm within the N-region. This assumption is plausible in considering that the growth of p-type layer having doping concentration of $1\times10^{16}/cm^3$ would be performed on the layer having $5\times10^{15}/cm^3$ of N-type doping concentration. The p-type impurities would diffuse to the N-type layer, and accordingly, the metallurgical junction is formed within N-type layer (larger band gap HgCdTe). The diffusion profile of p-type impurity was assumed to be a complementary error function.

Figure 6:
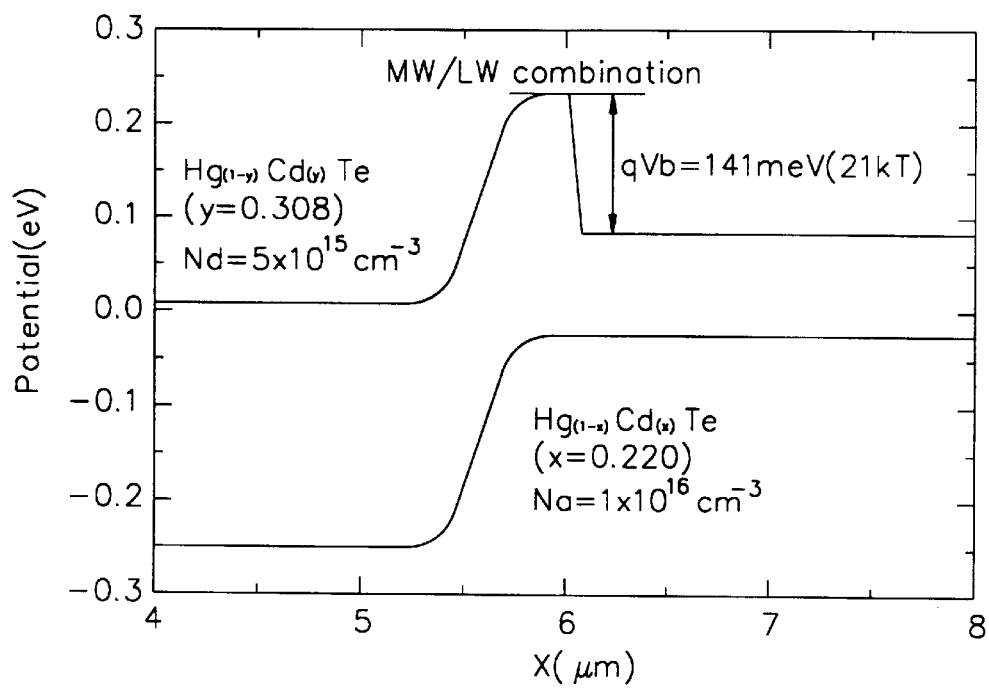
FIG. 6 is the energy band diagram of a two-color IR detector (MW/LW combination) according to the present invention for the case of linearly varied composition gradation of 2 μm in p-N junction.

The heterojunction analysis with a device simulator predicts that the potential barrier height of an abrupt (no composition grading) p-$Hg_{0.78}Cd_{0.22}$Te/N-$Hg_{0.69}Cd_{0.31}$Te is as large as 21 kT (141 meV) at the thermal equilibrium at 77 K of which the hole and the electron concentrations are $1\times10^{16}$ cm$^{-3}$ and $5\times10^{15}$ cm$^{-3}$, respectively. FIG. 6 shows that the potential barrier height of p-$Hg_{0.78}Cd_{0.22}$ Te/N-$Hg_{0.69}Cd_{0.31}$Te. The same figure for SW/MW combination can be found in the FIG. 7, which shows the potential barrier height is as large as 13.4 kT (89 meV) for p-$Hg_{0.69}Cd_{0.31}$Te/N-$Hg_{0.636}Cd_{0.364}$Te and the same doping concentrations as the MW/LW combination.

The barrier height of 13.4 kT is enough to prevent photogenerated minority carriers in the p-HgCdTe layer from diffusing to the N-HgCdTe layer. The probability of the minority carrier diffusing to the N-HgCdTe layer can be estimated by the simple Boltzmann equation of $\exp(-qV_B/kT)$. This equation says that the probability of the minority carrier diffusing to N-HgCdTe is only $1.5\times10^{-6}$. This prediction is very important for the proposed two-color detector, since sufficient potential barrier height guarantees no spectral crosstalk between the two photodiodes. In the case of the MW/LW two-color detector, the predicted potential barrier height is as large as 21 kT (141 meV). The probability of the minority carrier diffusion to the N-HgCdTe layer is $7.5\times10^{-10}$. In this combination, the probability of diffusion of the photogenerated minority carrier is much less than that of the case of layer SW/MW combination. Thus, for both cases of MW/LW and SW/MW combinations, minority carrier transport across the potential barrier in the p-N heterojunction is negligible.

From the results of the device simulation, it was confirmed that the variation of the potential barrier due to the composition grading width was not significant. In the state that the above-described conditions were fixed, the potential barrier heights were calculated for the composition grading width of 0 and 2 μm. As the results, the variation of the potential barrier due to composition grading width variation was not significant.

Figure 4:
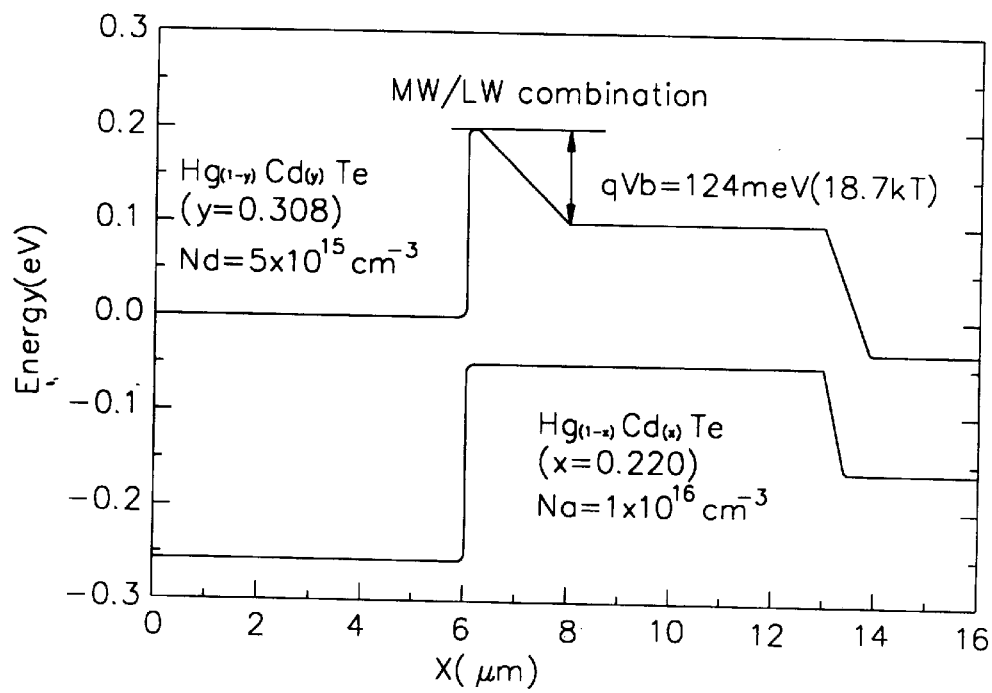
FIG. 4 is the energy band diagram of a two-color IR detector (MW/LW combination) according to the present invention for the case of no composition gradation in p-N junction.
Figure 5:
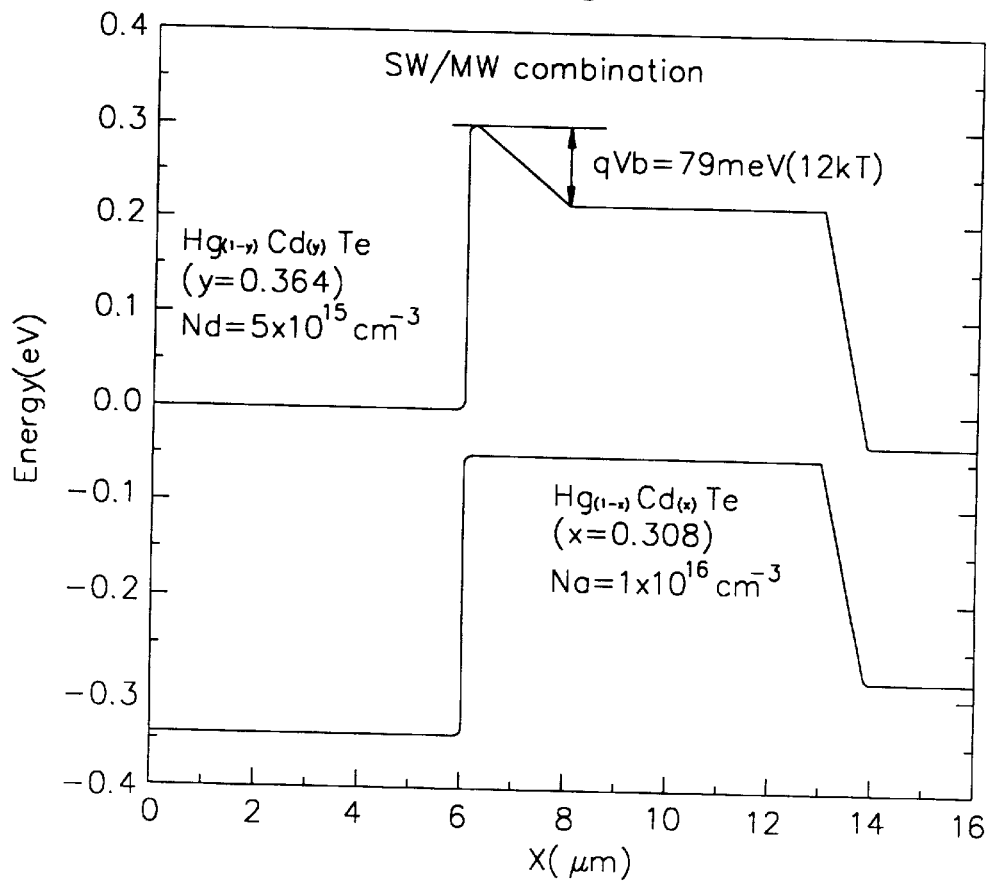
FIG. 5 is the energy band diagram of a two-color IR detector (SW/MW combination) according to the present invention for the case of no composition gradation in p-N junction.
Figure 7:
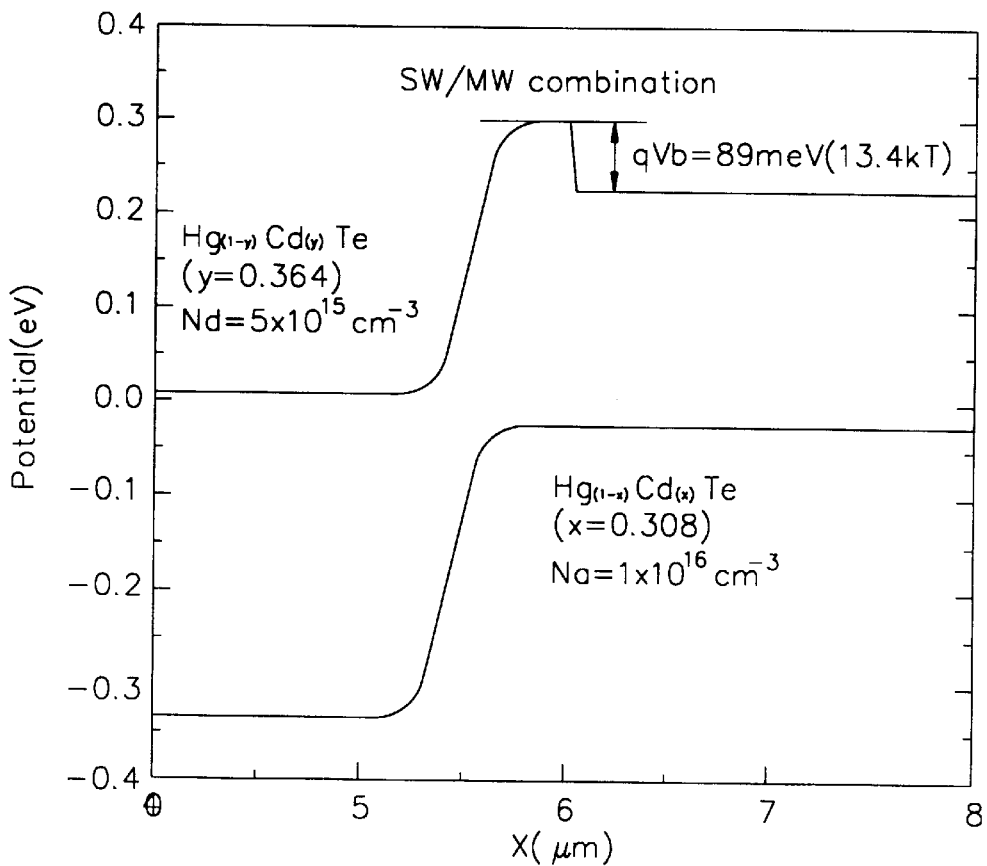
FIG. 7 is an energy band diagram of a two-color IR detector (SW/MW combination) according to the present invention for the case of composition gradation of p-N junction is linearly varied within a range of 2 μm.

FIGS. 6 and 7 in combination with FIGS. 4 and 5 show the effect of composition (x) grading width on the potential barrier height according to the embodiment of the present invention. FIG. 6 shows the energy band diagram of a MW/LWIR two-color detector. As shown in FIG. 4 the barrier height reduces to 124 meV (19 kT) when the composition grading width changes to 2 μm, but this is not significant, since the lowered barrier height is still high enough. The same tendency can be also found for the case of SW/MW combination as shown in FIG. 5. In contrast, the barrier height illustrated in FIG. 7, the barrier height reduces to 79 meV (12 kT) as illustrated in FIG. 5 when the composition grading width changes to 2 μm, but this is also not significant, since the lowered barrier height is still high enough.

The spectral quantum efficiency can be simulated by simultaneous solving drift-diffusion and Poisson's equations under the illumination of pre-defined light. The spectral quantum efficiency is obtained by computing the detector current $J_B (\lambda)$ due to the background photon flux $Q_B(\lambda)$ at wavelength λ, then calculating the additional current $\Delta J(\lambda)$ with flux $\Delta Q$. Then the quantum efficiency is given by $$\eta(\lambda)=\Delta J(\lambda)/q\Delta Q,$$

where q is the electron charge. Photogeneration model is adopted in the following equation $$G_p=\alpha(\lambda)\Phi_0 \exp(-\alpha x),$$

and absorption coefficient (α) of S. E. Schacham and E. Finkman, in "J.Appl. Phys. 57, 2001, (1985)" is used.

Figure 8:
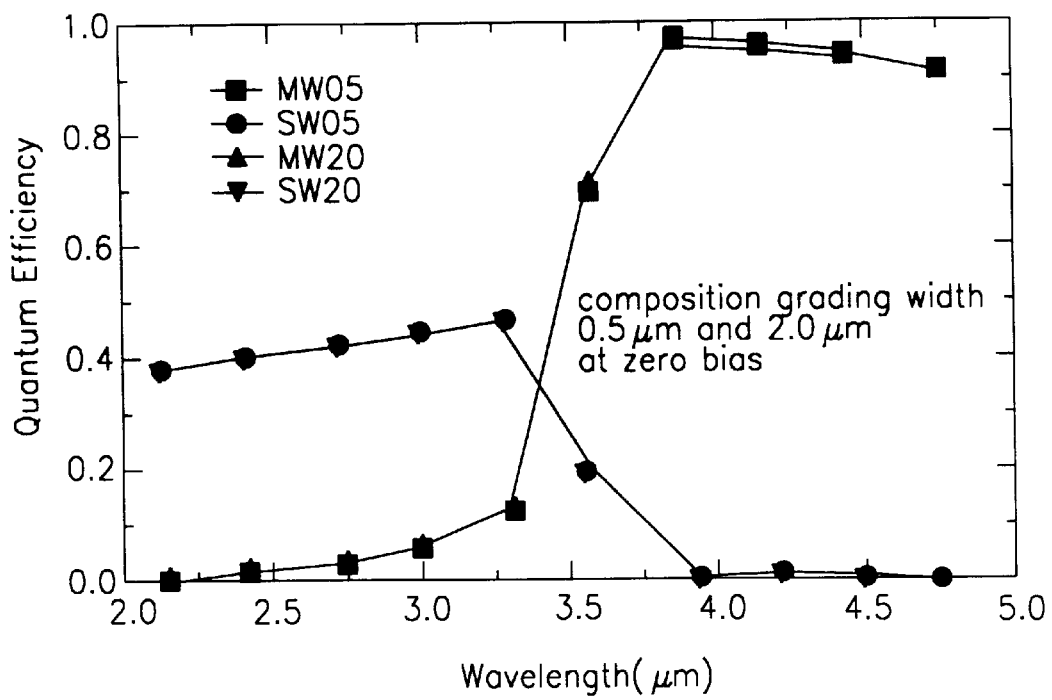
FIG. 8 is a spectral quantum efficiency of the two-color IR detector (MW/SW combination) according to the present invention.
Figure 9A:
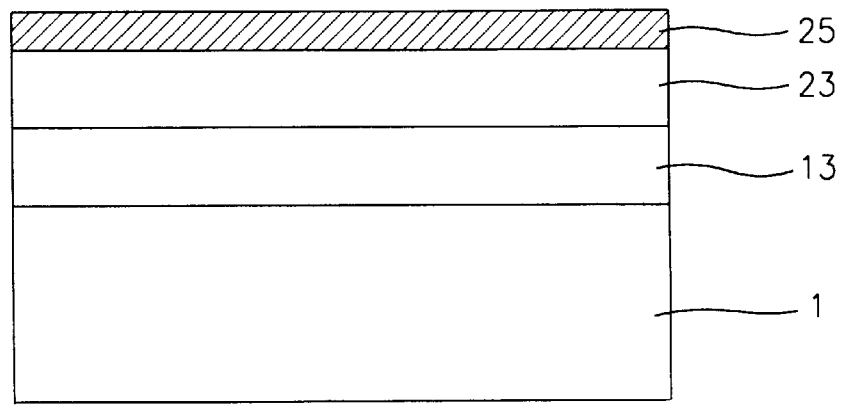
FIGS. 9A through 9H illustrate the fabrication sequence of a two color IR detector according to the present invention.
Figure 9B:
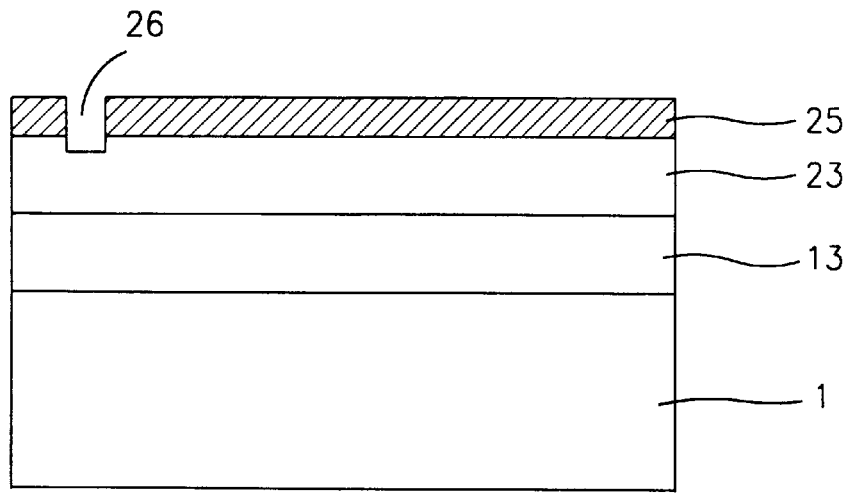
Figure 9C:
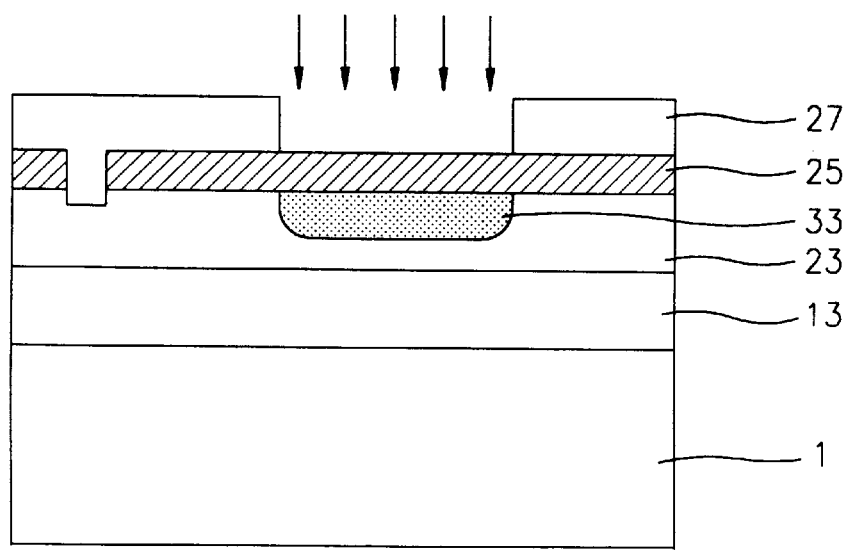
Figure 9D:
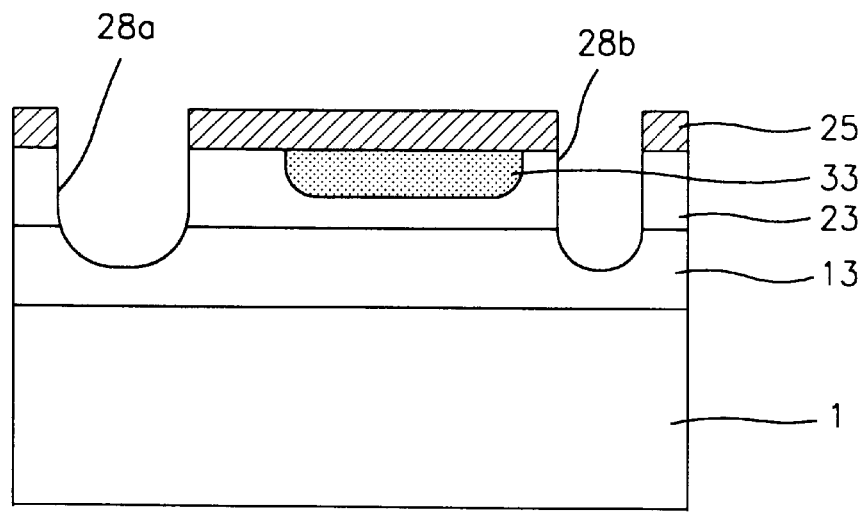
Figure 9E:
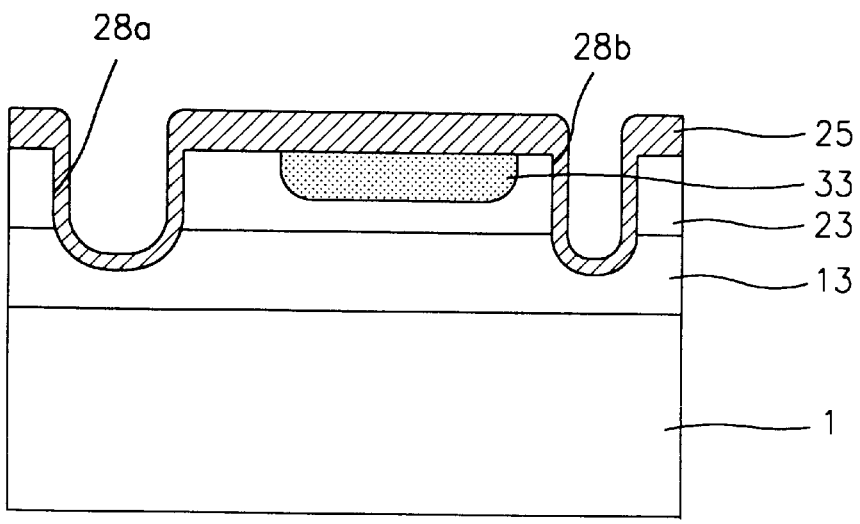
Figure 9F:
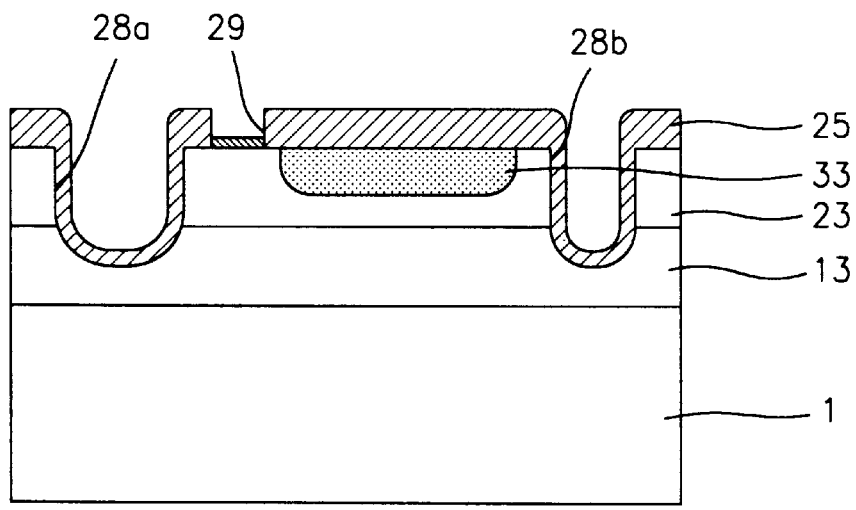
Figure 9G:
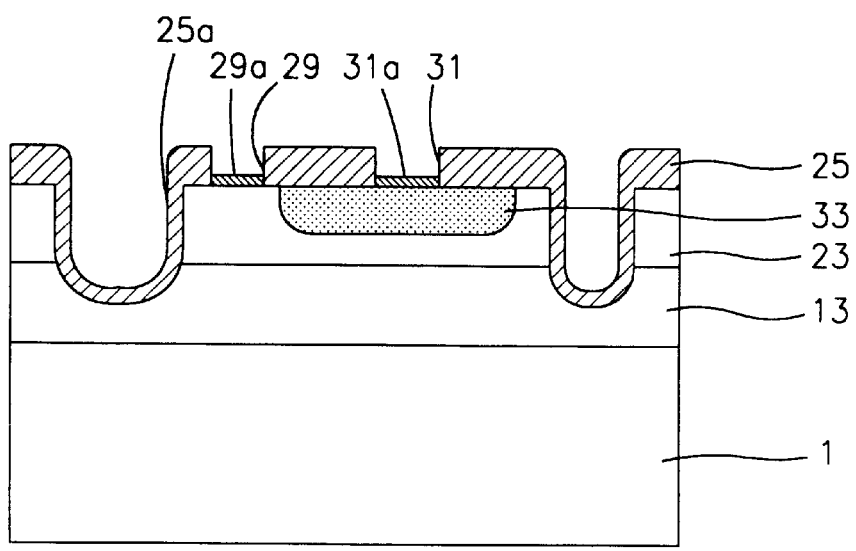
Figure 9H:
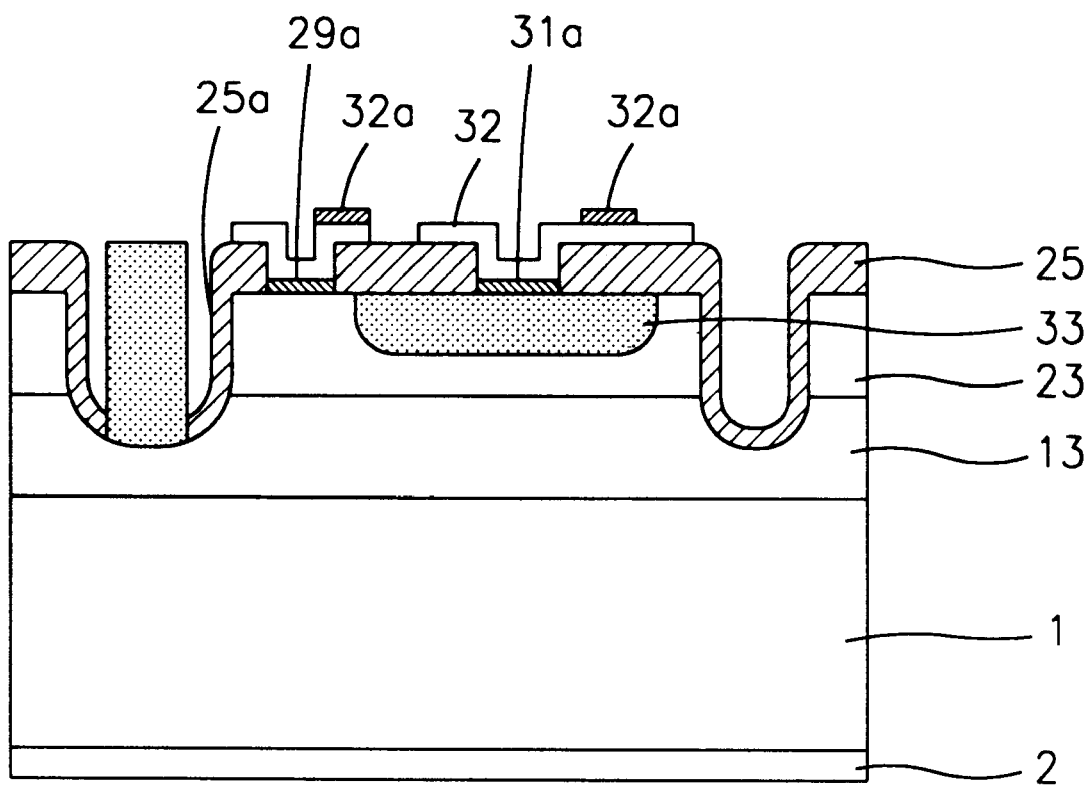

FIG. 8 shows the spectral quantum efficiency with the grading width variation obtained from 0 to 2 μm from device simulation. The simulation was carried out wherein the lengths of each layer are 6/6/2 μm for N/p/n and 2 μm for grading layer width for the SW/MW two-color case. It can be found in FIG. 8 that the cut on wavelength of the MW diode and the cut off wavelength of the SW diode are each 3.6 μm. It can be also found that the extent of the photoresponse of the SW diode to MWIR is negligible. The extent of the MW diode photo-response to SWIR is nearly zero in the wavelength range of below 3 μm and about 10% at a wavelength of 3.4 μm. It was observed that the spectral responses of the two photo-detectors are well distinguished. As expected, it was found that spectral quantum efficiency curve of the proposed two color IR detector shows no remarkable change with the grading width variation from 0 to 2 μm.

The fabrication process of disclosed IR two-color detector is as follows. FIGS. 9A through 9H show the process sequences for the disclosed IR two-color detector. The starting wafer includes an epitaxially grown two-layer p-N-HgCdTe (13, 23) structure on an IR transparent material (1) as aforementioned MW/LW or SW/MWIR detector pair. A ZnS layer (25) is evaporated as a dielectric material on cleaned wafer surface (23). Next, a step 26 is formed in the ZnS layer (26) which provides an alignment mark for the next steps. Prior to the cell isolation, ion-implantation for the formation of n-region in p-HgCdTe (33) is carried out under condition of $1\times10^{13}$ cm$^{-2}$ dose and 100 keV energy with PR masking (27). Another. approach could be possible for n-type formation on p-HgCdTe. That is, the epitaxial grown n-p-N-HgCdTe layer can be used for starting material for disclosed two-color detector. However, the ion-implanted p-n junction is preferred to an epitaxially grown n-p junction. The ion-implanted n-p junction has several advantages, as described above such as same level bumps in each unit cell and easy process. Cell isolation (28a, 28b) is carried out by etching HgCdTe to the N-layer 13. The etching solution used in cell isolation is HBr:$H_2O_2$:$H_2O$=4:1:60 in volume. After cell isolation, the first ZnS layer (25 in FIG. 9D) is stripped out and a second ZnS layer (25 in FIG. 9E) is evaporated. The remaining processes include formation of a metal-HgCdTe contacts (29, 29a, 31, and 31a), metal line (32) and bump formation (32a). After forming the bump, an anti-reflection layer (2) on the backside of IR transparent substrate should be formed.

Although the preferred embodiment of the present invention have been disclosed for illustrative purposes, those skilled in the art will appreciate that various modifications, additions and substitutions are possible, without departing from the scope and spirit of the invention as recited in the accompanying claims.

What is claimed is:

1. A two-color, two layer infrared(IR) detector including a first layer and a second layer, comprising:

a transparent semiconductor substrate;

the first layer comprising an N-type $HG_{(1-y)}Cd_{(x)}Te$ layer formed on a surface of the semiconductor substrate;

the second layer comprising a p-type $Hg_{(1-x)}Cd_{(x)}Te$ layer formed on the N-type $Hg_{(1-y)}Cd_{(y)}Te$ layer;

an n-type $Hg_{(1-x)}Cd_{(x)}Te$ layer formed on a predetermined portion of the p-type $Hg_{(1-x)}Cd_{(x)}Te$ layer;

a first bump formed on the p-type $Hg_{(1-x)}Cd_{(x)}Te$ layer; and a second bump formed on the n-type $Hg_{(1-x)}Cd_{(x)}Te$ layer.

2. The detector of claim 1, wherein ranges of y and x in value are between 0.28–0.32 and 0.19–0.25, respectively.

3. The detector of claim 1, wherein ranges of y and x in value are between 0.35–0.45 and 0.28–0.32, respectively.

4. The detector of claim 1, wherein an impurity doping concentration of the N-type $Hg_{(1-y)}Cd_{(y)}Te$ layer is about $5 \times 10^{15}/cm^3$, and an impurity doping concentration of the p-type $Hg_{(1-x)}Cd_{(x)}Te$ layer is about $1 \times 10^{16}/cm^3$.

5. The detector of claim 1 in which the N-type $Hg_{(1-x)}Cd_{(x)}Te$ layer is formed by ion implantation.

* * * * *